(12) United States Patent
Arsalan et al.

(10) Patent No.: US 8,519,345 B2
(45) Date of Patent: Aug. 27, 2013

(54) MINIATURIZED, LOW POWER FGMOSFET RADIATION SENSOR AND WIRELESS DOSIMETER SYSTEM

(75) Inventors: Muhammad Arsalan, Cornwall (CA); Atif Shamim, Mississauga (CA); Nicholas Garry Tarr, Ottawa (CA); Langis Roy, Ottawa (CA)

(73) Assignee: King Abdullah University of Science and Technology (KAUST), Thuwal (SA)

( * ) Notice: Subject to any disclaimer, the term of this patent is extended or adjusted under 35 U.S.C. 154(b) by 903 days.

(21) Appl. No.: 12/580,670

(22) Filed: Oct. 16, 2009

(65) Prior Publication Data
US 2010/0096556 A1 Apr. 22, 2010

Related U.S. Application Data

(60) Provisional application No. 61/105,921, filed on Oct. 16, 2008.

(51) Int. Cl.
*G01T 1/02* (2006.01)
*H01L 27/14* (2006.01)

(52) U.S. Cl.
USPC .................................................. 250/370.07

(58) Field of Classification Search
USPC .................................................. 250/370.07
See application file for complete search history.

(56) References Cited

U.S. PATENT DOCUMENTS

| 4,678,916 | A | 7/1987 | Thomson |
| 6,141,243 | A * | 10/2000 | Aslam et al. ............. 365/185.01 |
| 6,172,368 | B1 | 1/2001 | Tarr et al. |
| 6,402,689 | B1 | 6/2002 | Scarantino et al. |
| 7,495,224 | B2 | 2/2009 | Widener et al. |
| 7,557,353 | B2 | 7/2009 | Black et al. |
| 2006/0027756 | A1 * | 2/2006 | Thomson et al. ........ 250/370.07 |
| 2009/0018403 | A1 | 1/2009 | Black et al. |

OTHER PUBLICATIONS

Tarr, N. G. et al., "A Sensitive, Temperature-Compensated, Zero-Bias Floating Gate Dosimeter," IEEE Transactions on Nuclear Science, vol. 51, No. 3, Jun. 2004.
Shamim, Atif et al. "Wireless Dosimeter: System-on-Chip versus System-in-Package for Biomedical and Space Applications," IEEE Transactions on Circuits and Systems II: Express Briefs, vol. 55, No. 7, Jul. 2008.

(Continued)

*Primary Examiner* — David Porta
*Assistant Examiner* — Shun Lee
(74) *Attorney, Agent, or Firm* — Thomas|Horstemeyer, LLP

(57) ABSTRACT

A miniaturized floating gate (FG) MOSFET radiation sensor system is disclosed, The sensor preferably comprises a matched pair of sensor and reference FGMOSFETs wherein the sensor FGMOSFET has a larger area floating gate with an extension over a field oxide layer, for accumulation of charge and increased sensitivity. Elimination of a conventional control gate and injector gate reduces capacitance, and increases sensitivity, and allows for fabrication using standard low cost CMOS technology. A sensor system may be provided with integrated signal processing electronics, for monitoring a change in differential channel current $I_D$, indicative of radiation dose, and an integrated negative bias generator for automatic pre-charging from a low voltage power source. Optionally, the system may be coupled to a wireless transmitter. A compact wireless sensor System on Package solution is presented, suitable for dosimetry for radiotherapy or other biomedical applications.

21 Claims, 14 Drawing Sheets

(56) References Cited

OTHER PUBLICATIONS

Arsalan, Muhammad, "Wireless System-on-Chip Sensor Design for Radiotherapy Applications," Ph.D. Thesis, Carleton University, Jun. 2009.

Wang, Y. et al., "A Temperature, Supply Voltage Compensated Floating-Gate MOS Dosimeter Using VTH Extractor," Proceedings of the Fifth International Workshop on System-on-Chip for Real-Time Applications (IWSOC '05) 2005.

* cited by examiner

MINIATURIZED, LOW POWER FGMOSFET RADIATION SENSOR AND WIRELESS DOSIMETER SYSTEM

CROSS REFERENCE TO RELATED APPLICATIONS

This application claims priority from U.S. provisional application Ser. No. 61/105,921, entitled "Miniature Wearable Wireless Biomedical Sensor System", filed 16 Oct. 2008, which is incorporated herein by reference.

FIELD OF THE INVENTION

This invention relates to low power FGMOSFET sensor systems, and particularly to FGMOSFET radiation sensors and dosimeters for biomedical applications.

BACKGROUND OF THE INVENTION

IGFETs (insulated gate field effect transistors) may be used as sensors for detection of radiation by detecting a shift in threshold voltage ($V_{th}$) or other operating parameter after irradiation. On exposure to radiation, electron hole pairs are generated, and charge is trapped in an insulating layer of the device, e.g. a gate oxide, causing a change in electrical characteristics. Radiation detecting IGFETs, and more particularly silicon MOSFET (metal oxide semiconductor field effect transistor) devices for detection of radiation may be referred to as "RADFETs."

Conventional RADFETs are active devices, i.e. require application of a relatively high bias, ~20V, during irradiation to achieve suitable sensitivities ($\Delta V_{th}$ of ~1 mV/rad or more). They also need a thick gate oxide, which requires a custom CMOS process. Moreover, the threshold voltage has a strong dependence on temperature, and suitable compensation is required. As an example, U.S. Pat. No. 4,678,916, to Ian Thomson, entitled "Dosimeter", discloses the use of matched pairs of silicon MOSFETs. One MOSFET is forward biased during irradiation while operation of the other is inhibited. A measurement of the differential change in threshold voltage between the pair of MOSFETs provides for compensation of threshold drift and offset, and first order compensation of temperature effects.

Floating Gate MOSFET (FGMOSFET) sensors offer some advantages. In particular, the floating gate is pre-charged before irradiation. Thus, the device does not need to be biased during irradiation. Known radiation sensors based on FGMOSFETS are disclosed, for example, in U.S. Pat. No. 6,172,368. entitled "Method of monitoring radiation using a floating gate field effect transistor dosimeter, and dosimeter for use therein", to N. Garry Tarr and Ian Thomson. For improved sensitivity, this FGMOSFET relies on a large area extended floating gate over a relatively thick dielectric layer, e.g. field oxide, rather than a thick gate oxide. Preferably, the dosimeter comprises a pair of two identical FGMOSFETs with a common source, and each has an extended gate region, a control gate overlying the floating gate, and a charge injector gate. The floating gate of the sensor FGMOSFET is charged prior to irradiation, while the floating gate of the reference FGMOSFET is uncharged or charged with an equal and opposite charge. The dose is measured by monitoring the difference in $V_{th}$ between the two FGMOSFETs after irradiation.

In more recent work by the same inventors, an article entitled "A sensitive, temperature-compensated, zero-bias floating gate dosimeter", published in IEEE Transactions on Nuclear Science, vol. 51, no. 3, June 2004, by N. Garry Tarr et al. a FGMOSFET radiation sensor with improved sensitivity is disclosed. The device comprises a FGMOSFET sensor and a reference MOSFET, each having identical channel lengths and channel widths to compensate for temperature effects. Each has a large area extended gate over field oxide. Unlike most FGMOSFET sensors, the floating gate is not overlapped by a control gate, which boosts sensitivity by nearly an order of magnitude. Preferably, a minimum geometry injector gate overlapping the floating gate is provided for precharging the sensor. To protect the device from external electrostatic fields, a grounded electrostatic shielding electrode is provided over the floating gate, e.g. using a Metal 2 layer. Ring shields may also be provided using the first polysilicon and Metal 1 layers. Elimination of a control gate improves sensitivity, because the radiation generated charge is free to concentrate above the FGMOSFET channel. However, this means the charge on the floating gate must be determined from monitoring drain current, rather than a change in threshold voltage. Thus, read-out of the dose requires application of a small bias (~0.1V) to monitor the drain current. Peak sensitivity of around 3 mV/rad at floating gate potential of −7V was reported in this paper. This reference also discusses in detail cancellation of temperature and environmental effects by use of matched sensor and reference FGMOSFETs and optionally a separate temperature sensor. These FGMOSFET radiation sensors may be fabricated in almost any commercial CMOS process using two polysilicon layers, potentially allowing for integration with read-out and control circuitry.

Nevertheless, there is a need for further improvements in FGMOSFET radiation sensors to improve sensitivity and to allow fabrication using current standard CMOS processes that include only one polysilicon layer, i.e. a "single poly process", rather than a double polysilicon process. Moreover, although some available sensors are small, each one typically requires wired connections for power and read-out.

Wired connections may cause unpredictable scattering of radiation and for bio-medical applications it is also desirable to free patients and staff from the inconvenience of wired connections for powering and read-out of sensors.

To date, there are a limited number of commercially available wireless radiation sensor modules. Those available tend to be either bulky and/or not capable of real-time read-out or data transmission. For example, a portable, personal electronic dosimeter using an FGMOSFET sensor (DMC2000S) is manufactured by Mirion Technologies (formerly Synodys Inc.) (www.Mirion.com). A "mobileMOSFET" system (TN-RD-70-W) manufactured by Best Medical (www.bestmedicalcanada.com), uses a Bluetooth transmitter/power supply module connected with long wires to one or more MOSFETS sensors. A miniature implantable system with an inductive transmitter is disclosed in U.S. Pat. No. 6,402,689 to Scarantino et al., entitled "Methods, systems, and associated implantable devices for dynamic monitoring of physiological and biological properties of tumors." Other miniature sensors, as manufactured by Sicel Technologies are disclosed in U.S. patent publication no. 2009/0018403 entitled "Trackable implantable sensor devices systems and related methods of operation"; U.S. Pat. No. 7,557,353 entitled "Single-use external dosimeters for use in radiation therapies" and U.S. Pat. No. 7,495,224 entitled "Single-use external dosimeters for use in radiation therapies and related methods and systems" to Black et al.

In particular, elimination of wired connections during use and wireless real-time read-out would be desirable for biomedical monitoring, radiotherapy and other applications.

However, lower voltage operation and lower power operation is required to facilitate integration of MOSFET radiation sensors with low cost, miniaturized CMOS signal processing circuits and coupling to RF transceivers for wireless operation.

SUMMARY OF THE INVENTION

Thus, the present invention seeks to circumvent or mitigate the above-mentioned limitations of existing FGMOSFET sensor systems, or at least provide an alternative.

One aspect of the present invention provides a FGMOSFET radiation sensor comprising: a substrate comprising a device well; a source and a drain separated by a channel region defined in the device well; a floating gate extending over the channel region and separated therefrom by a gate dielectric layer, and an extension of the floating gate extending over a field dielectric layer adjacent the device well; a charge injector structure defined in the substrate underlying the floating gate and separated from the floating gate by a gate dielectric layer (i.e. a tunnel dielectric); and, another dielectric layer and an electrostatic shielding layer extending over the floating gate.

Elimination of a conventional control gate, and provision of a charge injector structure in the substrate, rather than a conventional charge injector gate over the floating gate, reduces capacitance and increases sensitivity. The substrate charge injector is isolated by a gate oxide layer from the floating gate and allows for pre-charging by electron tunneling. The charge injector may take the form of a shorted MOS transistor in the adjacent substrate underlying part of the floating gate. This structure can therefore be fabricated using a single polysilicon CMOS process. Since there is no control gate, the radiation dose may be monitored by applying a small bias, e.g. ~0.1V applied to the drain terminal, to monitor the channel current or drain current $I_D$.

Another aspect of the invention provides a radiation sensor comprising a matched FGMOSFET pair comprising a sensor FGMOSFET and a reference FGMOSFET on a common substrate, each FGMOSFET comprising a device well region of the substrate having defined therein a source and a drain separated by a channel region, a gate oxide overlying the channel region and a floating gate formed thereon, and the sensor FGMOSFET further comprising an extension of the floating gate extending over an adjacent field dielectric region; a respective charge injector means associated with each floating gate and separated therefrom by a gate dielectric layer; and another dielectric layer and a shielding layer overlying the floating gates.

Preferably, a reference FGMOSFET provides compensation for temperature effects, to which the drain current is sensitive. That is, a FGMOSFET sensor having a larger area floating gate and FGMOSFET reference having a much smaller area floating gate are provided, which in use, are both pre-charged to the same voltage. Preferably, the respective channel widths (W) and channel lengths (L) of the sensor FGMOSFET and the reference FGMOSFET are identical.

Each FGMOSFET has a charge injector, preferably provided in the adjacent substrate, underlying part of the floating gate, and isolated therefrom by a gate oxide or tunneling oxide, to allow for charging by Fowler-Nordheim tunneling from the charge injector, when sufficient voltage is applied to the charge injector.

The charge injector may comprise a second device well, e.g. laterally spaced from the first device well, and a source, a drain and a channel region formed in the second device well. The source and drain of the charge injector are shorted for coupling to a charging source. A gate dielectric layer formed over the channel isolates the injector structure from the floating gate of the respective sensor or reference FGMOSFET, but allows for charging by drain tunneling.

Preferably the FGMOSFET sensor and reference are p-channel devices, to take advantage of lower 1/f noise. The charge injector structure preferably comprises a p-channel MOS device defined in a p-doped device well, although an n-doped well may be used.

The sensor and reference FGMOSFETS may be fully shielded, for example, by providing an electrostatic shielding layer overlying the floating gate, preferably Metal 3 of a multilayer metal CMOS process, over a thick dielectric layer, e.g. BPSG or other inter-metal dielectric layers.

In preferred embodiments, sensitivity was observed to be improved by about 10% when the capacitance to the floating gate is reduced by eliminating a conventional charging gate on top of the floating gate, and using elevated metal shielding to allow for a thicker dielectric layer underneath the shielding electrode. Both the enhanced sensitivity and presence of an identical FG reference MOSFET permit lower voltage operation.

The respective floating gates of the sensor and reference FGMOSFETS may be interdigitated, and a radiation sensor may comprise two or more pairs of FGMOSFETS coupled in parallel. In each pair, a matched FGMOSFET reference provides compensation for effects of environmental and process changes, particularly if an interdigitated sensor and reference FGMOSFET structure is used.

Since the radiation sensor may be fabricated using standard CMOS technology, and is operable at low voltage, it may be integrated more readily with signal processing circuitry for read-out, e.g. by detecting a change in an operating parameter, such as a change in channel current $I_D$, indicative of radiation dose. The signal processing circuitry may comprise a current-to-voltage converter and a differential amplifier, which is monolithically integrated on the same substrate. After pre-charging, this device does not require any power during irradiation, and requires application of only a small bias (0.1V) to provide for read-out of a change in drain current. A low voltage power source such as a rechargeable cell or ultracapacitor or cell may provided for powering of the read-out circuitry for real time read-out.

Pre-charging circuitry, comprising a negative bias generator for programming the sensor, may also be integrated on-chip. Preferably, the pre-charging circuitry may also be operated from a low-voltage power source and comprises a negative bias generator comprising a charge pump.

This architecture also allows for a sensor system, such as a system-on-package assembly, which further comprises a wireless transmitter circuit for encoding and transmitting a signal generated as an output signal from the signal processing circuitry. Desirably, the transmitter circuit is integrated on the same substrate, for example, a package substrate, with the signal processing electronics for the read-out circuitry and a package antenna. For example, for bio-medical applications, the sensor may be coupled to a transmitter circuit, which is operable for transmitting at a frequency in the 5 GHz U-NII band, an international standard for biomedical applications. For wireless operation, a sensor system may be provided with a rechargeable power source, preferably a miniature, radiation transparent power source, such as a lithium polymer cell and/or an ultracapacitor, for powering the signal processing and transmitter electronics.

Another aspect of the invention provides a method of measuring a radiation dose using a radiation sensor comprising a matched pair of FGMOSFETs, the pair comprising a sensor FGMOSFET and a reference FGMOSFET each having similar channel widths and channel lengths, and the sensor MOSFET having an extended area extension of the floating gate overlying a field oxide layer, the method comprising the steps of: pre-charging floating gates of each of the sensor and reference MOSFETs to a predetermined value; exposing the FGMOSFETs to radiation and monitoring the differential channel current of the sensor and reference MOSFETS.

Monitoring the change in differential channel current may comprise applying a bias, continuously or intermittently, between the source and drain of each FGMOSFET, coupling the channel current output to signal processing circuitry comprising current to voltage converter and a differential amplifier, and generating an output voltage indicative of radiation dose. Optionally the method comprises coupling said output voltage indicative of radiation dose to an input of an RF oscillator transmitter for encoding and real-time wireless transmission of a signal indicative of radiation dose.

Thus, embodiments of the invention provide a miniaturized, sensitive and reliable low power radiation sensor, which may be fabricated in standard low-cost CMOS technology, which may be more readily integrated monolithically with signal processing circuitry, and coupled with a wireless transmitter.

These, and other features of the invention, will become more apparent from the following description, in which reference is made to the appended drawings, illustrating embodiments of the invention, by way of example only.

DETAILED DESCRIPTION OF EMBODIMENTS

Figure 1:
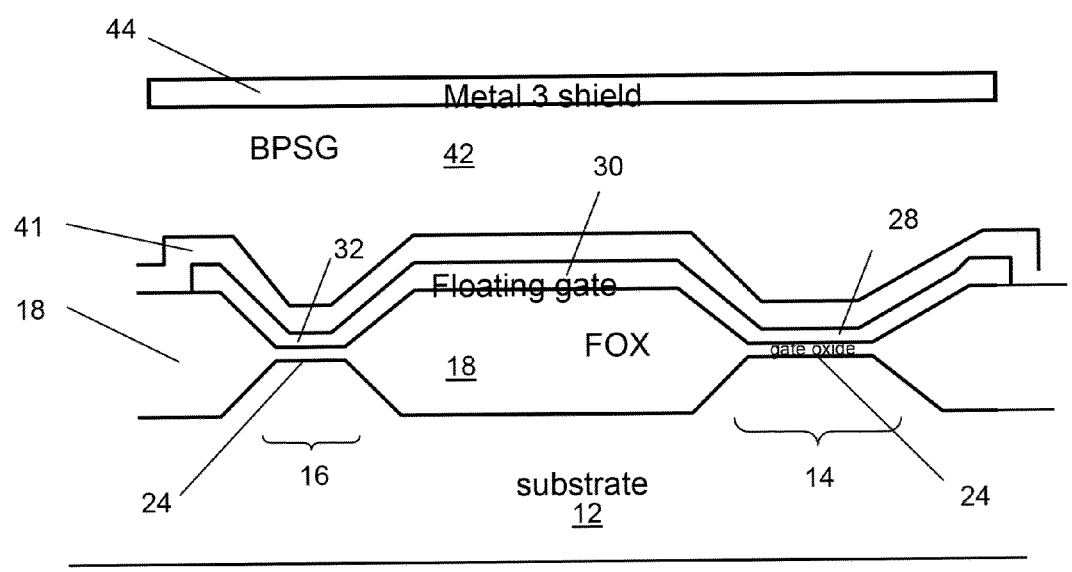
FIG. 1 shows a schematic cross section of a single FGMOSFET sensor, according to a first embodiment of the present invention.
Figure 2:
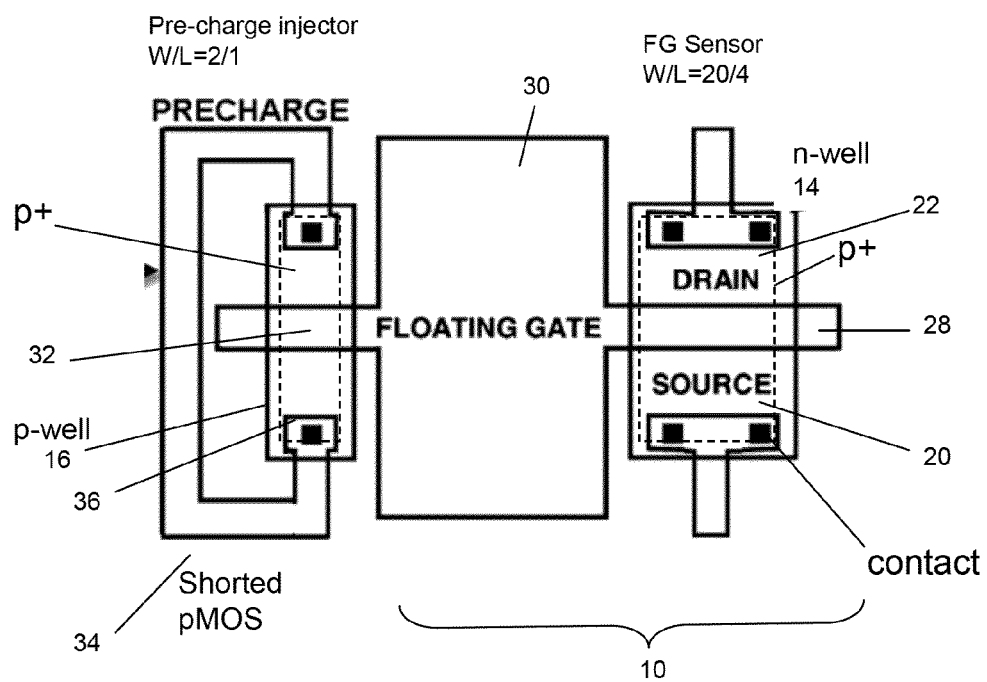
FIG. 2 shows a top view of part of the layout of the FGMOSFET sensor shown in FIG. 1.

A radiation sensor 1 comprising a FGMOSFET 10 according to a first embodiment of the present invention is shown schematically in cross-section in FIG. 1. A top view of part of the layout is shown in FIG. 2. The exemplary device structure 1 may be fabricated using a standard 0.8 μm CMOS process (DALSA) with a single polysilicon layer. The FGMOSFET comprises a p-channel device fabricated on a silicon substrate 12, in which a first device well region (n-well) 14 and a second device well region (p-well) 16 are defined, separated by field oxide regions (FOX) 18. As shown in FIG. 2, source 20, drain 22 and channel 24 regions of the sensor FGMOSFET 10 are defined in the substrate in the first device well 14. A standard thickness gate oxide layer 24 is provided over the channel region and a floating gate 28 is formed thereon, comprising a polysilicon layer (Poly 1). The floating gate 28 also comprises a larger area extension 30, provided by the first polysilicon layer, which extends over the field oxide layer 18, and further comprises a portion 32 extending over the second device well 16, for coupling to a charge injector structure 34 formed in the substrate 12. The portion 32 of the floating gate 28 is isolated from the underlying structure 32 by gate oxide layer 24. Thus, instead of a conventional charging gate overlying the floating gate 28, the charge injector 34 comprises a substrate electrode in the form of a shorted pMOS, comprising a source 36, drain 38 and channel 40 having a gate oxide layer 24 provided on the channel region 36, underlying a floating gate portion 32. The floating gate 28, including extension 30 and portion 32, is fully shielded by providing, an interpoly or field oxide 41, an overlying thick dielectric layer 42, e.g. layers BPSG (borophosphosilicate glass) or other suitable intermetal dielectric layers, together with an overlying electrostatic shielding layer 44. In this embodiment, the shielding layer 44 is defined by Metal 3, rather than Metal 2, of the CMOS process, to allow for an increased thickness of dielectric layer 42. The use of elevated Metal 3 increases the effective volume of the thick dielectric layer 42 for production of electron-hole (e-h) pairs during irradiation, thereby improving sensitivity.

The purpose of the large area extension 30 of the floating gate is to provide a larger area for capture of radiation-generated charge from the thick FOX 18. Preferably, p-channel transistors are utilized for the sensor transistor due to their superior 1/f noise performance as compared to the equivalent n-channel transistors. In this embodiment, these transistors have channel lengths (L) and widths (W) of 4 μm and 20 μm, respectively.

Figure 3:
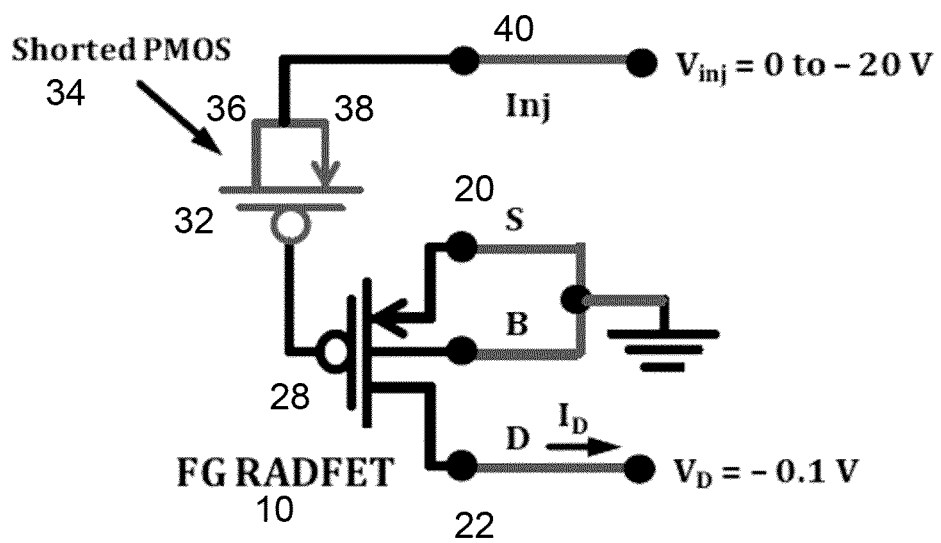
FIG. 3 shows schematically FGMOSFET (FGRADFET) biasing during FG programming (pre-charging), using the charge injector structure.

In use, the floating gate 28 is charged by application of sufficient voltage $V_{inj}$ to the charging structure 34, as shown in FIG. 3, to initiate Fowler-Nordheim tunneling through the gate oxide 24 i.e. a tunnel oxide layer, to transfer charge to the floating gate 28. Since the FGMOSFET 10 does not have a control gate as in a conventional RADFET, the radiation dose cannot be monitored in the conventional way, i.e. by monitoring a shift in threshold voltage $V_{th}$. Instead, the radiation dose is monitored by a change in channel current, i.e. by applying a small bias, i.e. ~0.1 V, to the drain 22 and monitoring the drain current $I_D$ as illustrated in FIG. 3. However, $I_D$ is a strong function of temperature and therefore, temperature compensation is needed.

Figure 4:
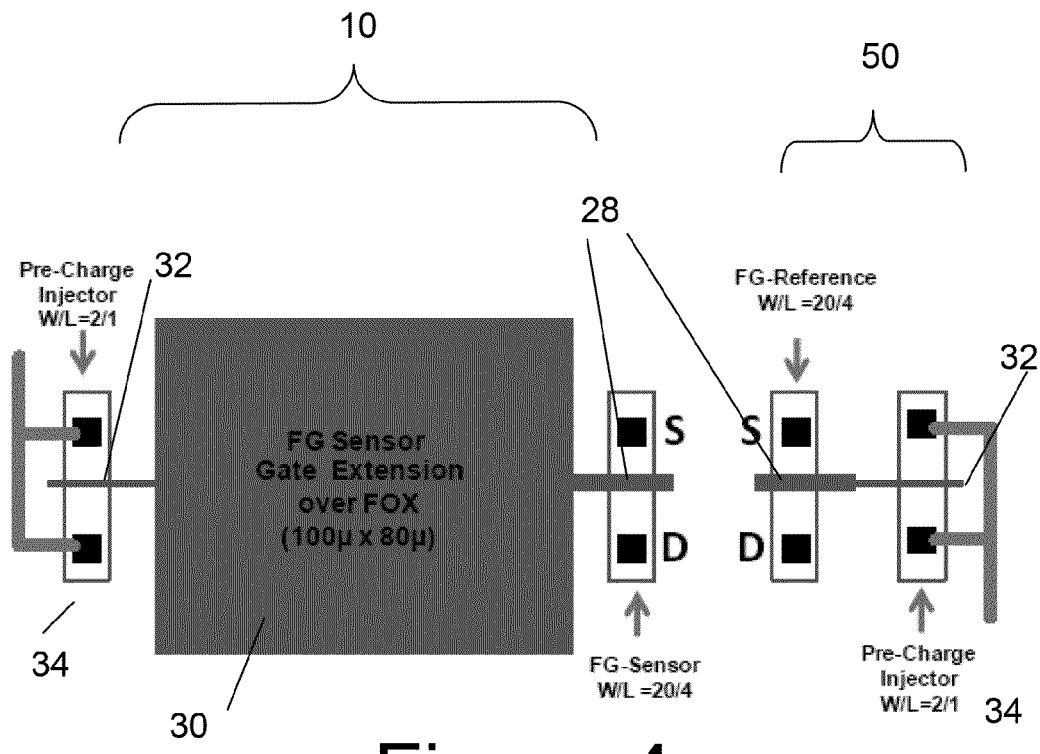
FIG. 4 shows a top view of the layout of part of a sensor comprising a matched FGMOSFET pair comprising a sensor FGMOSFET and a reference FGMOSFET, according to a second embodiment of the present invention.

To compensate for temperature dependence of the drain current, preferably the sensor FGMOSFET 10 is combined with a reference FGMOSFET 50, as shown in FIG. 4, to enable differential operation. FIG. 4 shows a top view of the FGMOSFET sensor 10 and a reference FGMOSFET sensor 50. The sensor 10 and reference 50 FGMOSFETs are preferably a matched pair having identical respective source, drain and channel dimensions, i.e. channel width (W) and channel length (L), but only the sensor FGMOSFET 10 has an extended area floating gate, i.e. the large area extension 30 over the field oxide (FOX) 18. This extension may for example be 100 µm by 80 µm to provide a relative large area to enhance radiation capture relative to the reference FGMOSFET. Each FG MOSFET 10 and 50 has an adjacent charging structure in the form of a pre-charge injector 34 as described above. The relative dimensions the channel regions of the devices, and the relative dimensions of the floating gate 28, floating gate extension 30 and charge injector portion of the floating gate 32 are represented schematically in FIG. 4. In use, the floating gates of both the sensor and the reference MOSFETs are pre-charged to the same value Vp before irradiation, and drain current $I_D$ is monitored during or subsequent to irradiation by applying a small bias of ~0.1V.

This structure offers a number of benefits. An extended floating gate over a thick dielectric, i.e. field oxide (FOX) 18 is provided to accumulate charges and increase sensitivity. Even in most advanced CMOS processes FOX is thick enough, e.g. 0.45 µm, to provide measurable sensitivity. Elimination of a conventional control gate reduces capacitance to the floating gate for increased radiation sensitivity. The tunneling structure 34 used for the charge injector 34 does add some capacitance to the floating gate, but it is negligible compared to a conventional poly-injector gate overlying the floating gate.

The metal shielding layer 44 and BPSG dielectric layer 42 are opaque to UV light and thus, they preclude charging by UV light exposure. Instead, application of a charge via the charging structure 34, i.e. charging the injector gate adjacent the FGMOSFET, provides for programming or pre-charging quickly (in a fraction of a second) by applying sufficient voltage for charging via Fowler-Nordheim (FN) tunneling. High fields provide for faster charging, but tend to lead to earlier wear-out or breakdown. A high quality gate oxide, with low trap density, and uniform thickness are preferred to avoid hot spots and premature breakdown. The relationship between the FN tunneling current $I_{fn}$ is given by:

$$I_{fn}=C_1 WL(E_{ox})^2 \exp(-E_0/E_{ox}) \quad (1)$$

Where $C_1$ and $E_0$ are constants, W and L are the width and length of the floating gate of the [injector structure] device, and $E_{ox}$ is the electric field across the gate oxide.

Figure 5:
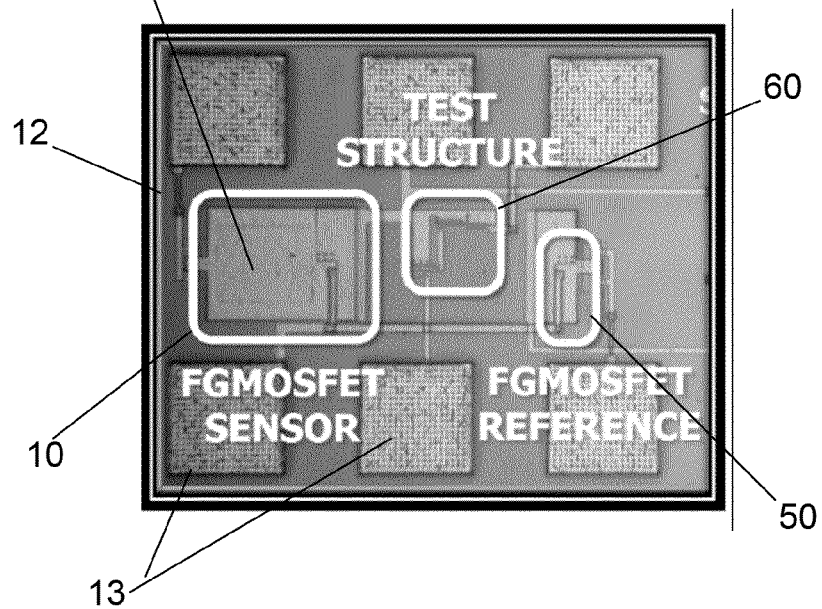
FIG. 5 shows a photomicrograph of the integrated circuit comprising a FGMOSFET sensor comprising a sensor FGMOSFET and a reference FGMOSFET, and a reference P-MOSFET, according to the second embodiment.

A microphotograph of a dosimeter chip comprising sensor FGMOSFET 10 and reference FGMOSFET 50, fabricated in a standard thick oxide 0.8 µm (DALSA) CMOS process as described above is shown in FIG. 5. The FGMOSFET sensor, as illustrated, has large-area floating gate extension 30 (100 µm by 80 µm) over the field oxide. Also shown is a standard pMOS reference 60, which is included on the chip for reasons described below. The overall dimensions of the chip are 300 µm×400 µm, including pads, including I/O pads 13

Figures 6A, 6B:
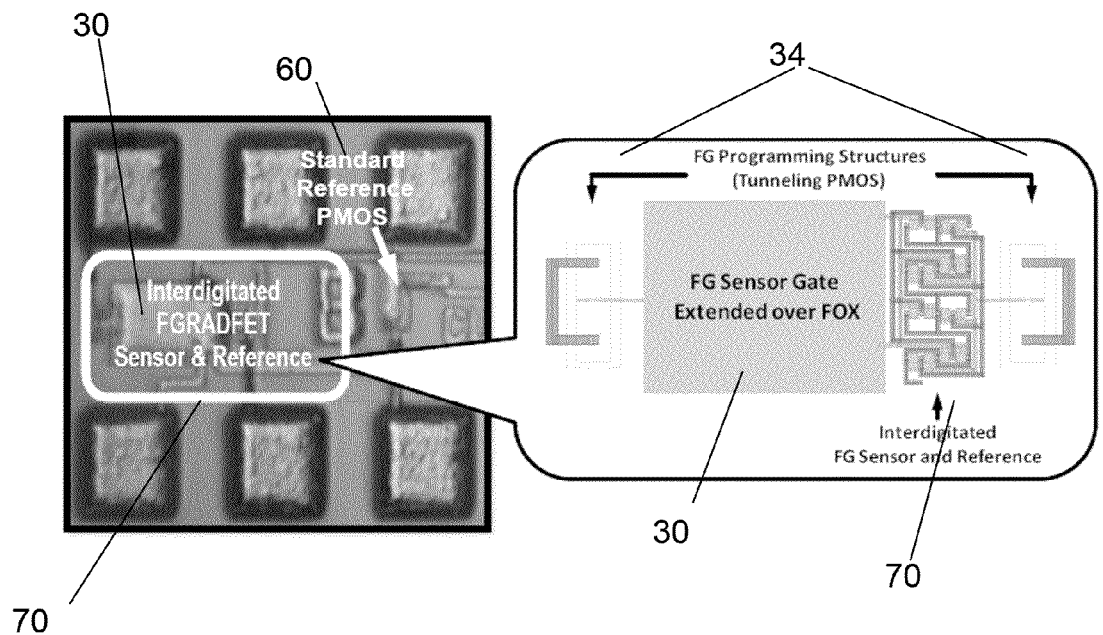
FIG. 6 shows A) a photomicrograph and B) a schematic diagram of an integrated circuit comprising a FGMOSFET sensor comprising an interdigitated sensor FGMOSFET and a reference FGMOSFET, according to a third embodiment.

A sensor, according to a third embodiment, is shown in FIG. 6, which shows A) a photomicrograph and B) a schematic layout of a radiation sensor comprising a FGMOSFET pair that are similar to those shown in FIG. 4, but wherein the sources, drains and gates, other than the large area floating gate extension 30, of the sensor and reference FGMOSFETS, comprise an interdigitated structure 70 to more effectively neutralize gradient effects and temperature variations across the chip. Each has a charging structure or charge injector 34, as described above. This embodiment provides for improved matching of component values to compensate for environmental and process variations, particularly for differential operation. The design provided improved accuracy, precision and a lower resolvable radiation sensitivity, because common mode variation was filtered out more effectively and improves signal to noise ratio. However, sensitivity was observed to be slightly reduced relative to the embodiment shown in FIGS. 4 and 5.

Figures 7A, 7B:
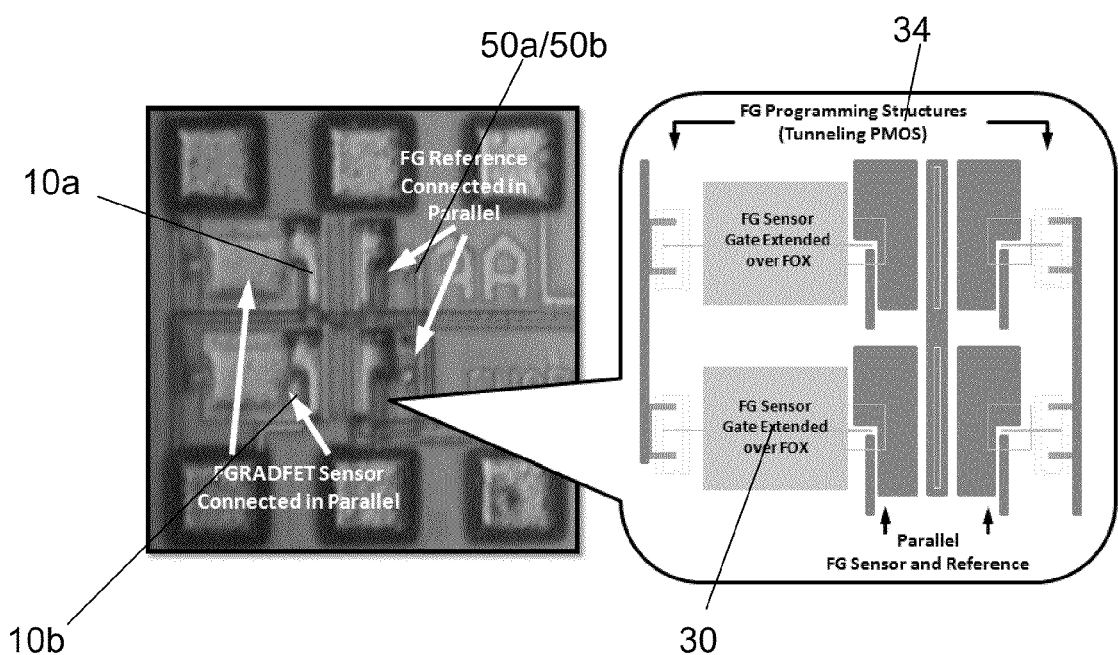
FIG. 7 shows A) a photomicrograph and B) a schematic diagram of an integrated circuit comprising a FGMOSFET sensor comprising two FGMOSFET pairs connected in parallel, according to a fourth embodiment.

A sensor, according to a fourth embodiment, is shown in FIG. 7 which shows A) a photomicrograph and B) a schematic layout of a FGMOSFET sensor comprising two pairs of sensor and reference FGMOSFETs 10a/50a and 10b/50b connected in parallel. Stacking of multiple sensors improves the sensitivity linearly with the number of stacked units. For example, the device shown in FIG. 7 with two sensor/reference FGMOSFET pairs in parallel, had an effective sensitivity of 15.1 nA/rad (3 mV/rad) compared with 7.75 nA/rad (1.5 mV/rad) for a single sensor/reference FGMOSFET pair shown in FIGS. 4 and 5. At the same time, 1/f noise of the individual units will accumulate, which increases the minimum level of resolvable dose.

In addition to radiation sensitivity, i.e. change in threshold voltage $V_t$ relative to the radiation dose in rads, measured in mV/rad, other important RADFET parameters are long term-fading and endurance, read-time stability, flicker (1/f) noise and resolution. In the embodiments described herein, flicker noise can be reduced by use of larger device channel areas, use of MOS fabrication process optimized for low noise, and/or use of a buried channel FGMOSFET sensor structure.

Charge stability is the tendency to lose charge immediately after programming and need for time to stabilize after charging. Stabilized states are typically defined as less than 1% change in channel current per day. Stability of the sensor is dependent on the large volume of BPSG above the floating gate extension over the field oxide. Stabilization of the device can be achieved by long-term storage 6 to 18 months before use, or slow charging, e.g. in smaller increments 10 mV vs. 100 mV, but these options may be impractical. A preferred approach is annealing for stabilization. This is a well known way to remove trapped charges from BPSG. For example, annealing for 1 hour at 150 degrees Celsius. significantly reduces defects and trapped charges.

Advantageously, as mentioned above, it was found that use of Metal 3 shielding rather than Metal 2 shielding, i.e. effectively increasing the dielectric thickness above the floating gate for storing charge, also provided an increase in sensitivity. Sensitivity may be increased by using very large extensions of FG structures, which are grounded during fabrication to reduce processing damage, and post-processed to provide a large-area floating gate.

The FGMOSFET architecture used in the embodiments described above provides for low-power, low-voltage operation, and facilitates fabrication using standard CMOS technology. High sensitivity of 7 nA/rad or 1.5 mV/rad at normal chip voltages, e.g. 1.2V, and operation at a lower voltage with respect to other known MOSFET sensors facilitates monolithic integration with the read-out circuitry and other signal processing functionality, using standard CMOS process technology.

Preferably, the sensors are fully shielded, i.e. by polysilicon and Metal 1 ring shields around the device and by the overlying electrostatic shielding layer provided by Metal 3 rather than Metal 2, for increased thickness of the dielectric layer under the shielding layer. In particular, when the sensor is integrated with other circuitry on-chip, as will be described below, this shielding helps to avoid the unwanted variation in the floating gate potential caused by the bias applied to other devices on the chip.

Embodiments will now be described in which signal processing electronics comprising read-out circuitry is monolithically integrated with a radiation sensor comprising a sensor and reference FGMOSFET pair as described above.

Integration of Signal Processing Electronics

Figure 8:
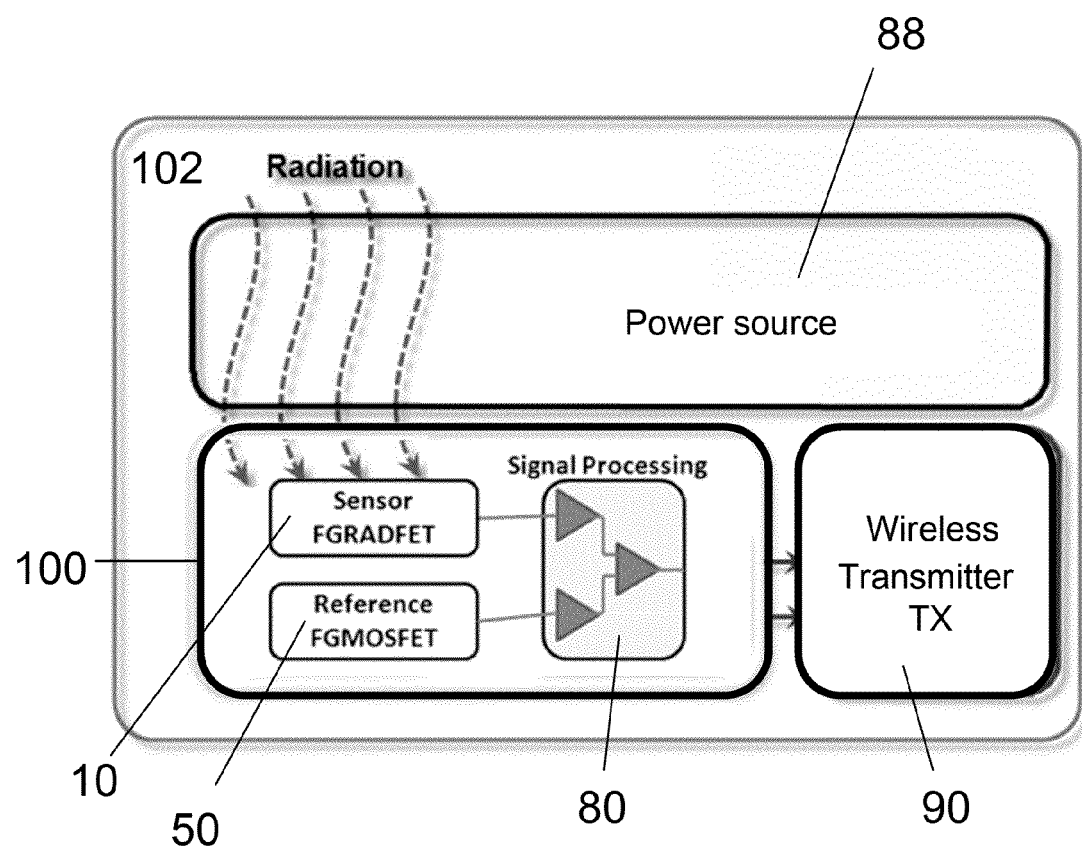
FIG. 8 shows a schematic block diagram of a sensor system, according to yet another embodiment of the invention, suitable for fabrication as a system-on-package (SoP) with integrated signal processing.

FIG. 8 shows a block diagram illustrating a sensor system 100 comprising a radiation sensor comprising a sensor FGMOSFET 10 and a reference FGMOSFET 50 similar to the embodiments described above, monolithically integrated on the same substrate 102 with signal processing electronics (SPE) 80 comprising read-out circuitry. Optionally, as shown, the output signal of SPE is suitable for coupling to the input of a wireless transmitter circuit 90 for wireless operation. While the sensor does not require power during irradiation, a power source 88 provides power for operation of the SPE 80, and the wireless transmitter 90, so that real time read-out of dose is possible.

Figure 9:
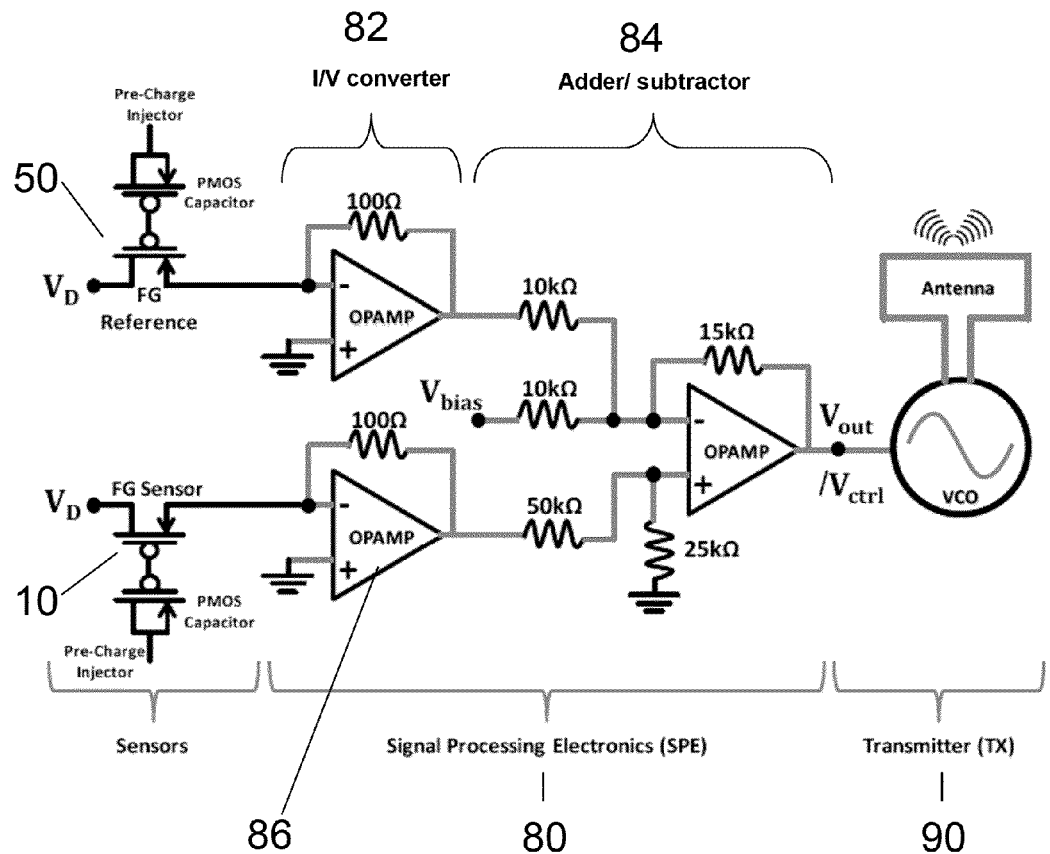
FIG. 9 shows a circuit schematic for the sensor system comprising a FGMOSFET pair and signal processing electronics, as illustrated in FIG. 8.

A corresponding circuit schematic is illustrated in FIG. 9 and shows the reference 50 and sensor 10 FGMOSFETS, comprising their pre-charge injector structures 34, coupled to signal processing electronics 80 comprising a current to voltage converter 82 and adder/subtractor 84 for generating a voltage output, $V_{out}$, dependent on the differential drain current $I_D$ from the sensor and reference FGMOSFETS. The signal processing circuitry has two stages, the first being an active current to voltage, i.e. I to V converter 82, to convert the FGRADFET channel currents $I_D$ input into equivalent voltage. The second stage is an adder/subtractor 84 designed to produce the output voltage in the desired range using converted voltage signals from the FGRADFET devices. The SPE circuitry uses a custom add/subtract circuit.

Figure 10:
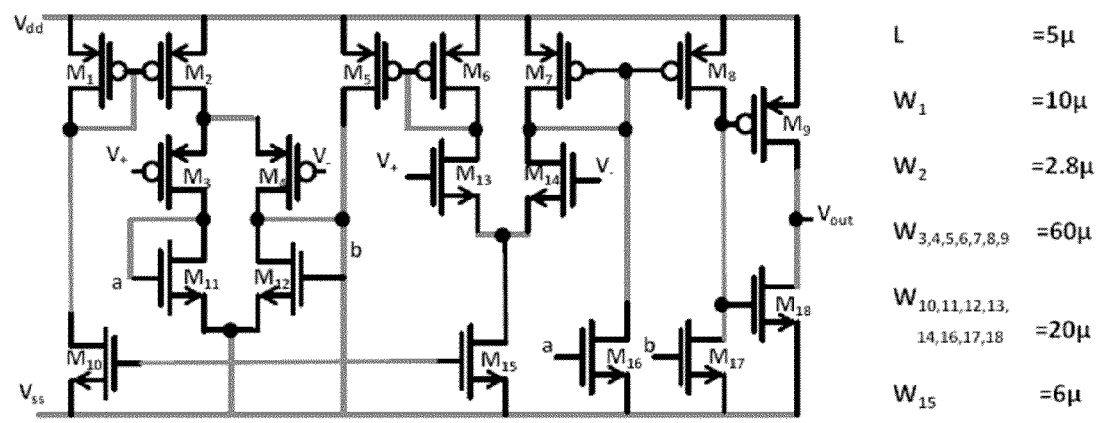
FIG. 10 shows a circuit schematic for a 3 stage high gain operational amplifier as used for the embodiment shown in FIG. 9.

The heart of the SPE is a dual supply, three-stage high gain operational amplifier (op-amp) with an output buffer, as shown in FIG. 10. The measured open loop gain is 70 dB. Dual supply op-amps have zero potential at the input terminals, which help to avoid dc level shifts in the output terminal of the previous stage. There is no feedback in this design, so no compensation circuit is required. This circuit was designed assuming an initial programmed charge of −6V on FGRADFETS with a sensitivity of 2 mV/rad. 1 krad radiation dose is sufficient to bring the FG charge down to −4V. The SPE is tailored to give a change in output from 350 mV to 750 mV for this change in FG sensor potential. Suitable values for the circuit components are illustrated in the circuit diagram, shown in FIG. 10, calculated for a desired output voltage of 0.3V to 0.8V. Optionally, an output signal in this voltage range can be used to drive a wireless transmitter, such as a VCO transmitter, as shown FIG. 9.

Figure 11:
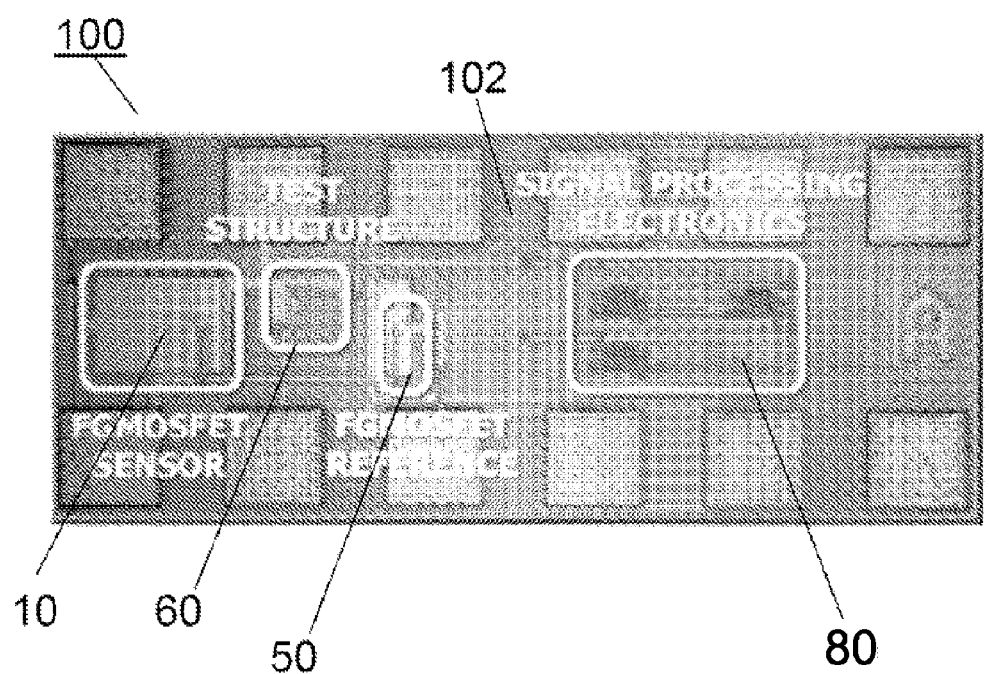
FIG. 11 shows a photomicrograph of an integrated circuit chip comprising a sensor system such as that shown in FIG. 9, comprising as sensor and reference FGMOSFET pair, and a test structure, integrated with on-chip signal processing.

A photomicrograph is shown in FIG. 11, which illustrates an integrated circuit chip 100 comprising a sensor FGMOSFET 10 and reference FGMOSFET 50, monolithically integrated on a common substrate 102 with signal processing electronics (SPE) circuitry 80. Also shown, is a reference pMOSFET test structure 60. The sensor system is operable in a continuous reading mode to reflect change due to incident radiation without delay.

A differential architecture provides for rejection of common mode noise and matching of critical circuit elements. The circuit produces the required control voltage to modulate the transmitted wireless signal, for example over the 5.2 to 5.4 GHz U-NII band. Sensitivity of up to 400 KHz/rad has been achieved. The active power of the dosimeter of the embodiment described above is ~2 mW.

When the FGMOSFET radiation sensors are integrated with signal processing electronics, preferably the FGMOSFETS are fully shielded by grounded shielding structures, e.g. rings, provided by the polysilicon layer and Metal 1 and Metal 2 layers, as well as a metal 3 shielding layer, as described above, to avoid unwanted variation in the FG potential caused by the bias applied to other devices on chip.

In considering layout for design of the SPE for integration with the sensor MOSFETs, all circuit components were implemented using common centroid and interdigitated layout techniques to achieve maximum accuracy and minimize error due to on-chip circuit component mismatches. Dummy resistors were used at the corners to provide each resistor as identical operating conditions as possible. For the adder/subtractor circuits, matching values of resistors is important as the output voltage shift is dependent upon ratios of the resistor values, and any mismatch in values due to poor layout may result in an error in the out put voltage which will eventually be translated into an error in radiation dose measurement.

The on-chip circuitry may also includes a pre-charging circuitry comprising a negative bias generator, which eliminates the need for a second negative voltage supply, and enables on-chip programming, i.e. pre-charging of the floating gate, as will now be described.

Figure 12:
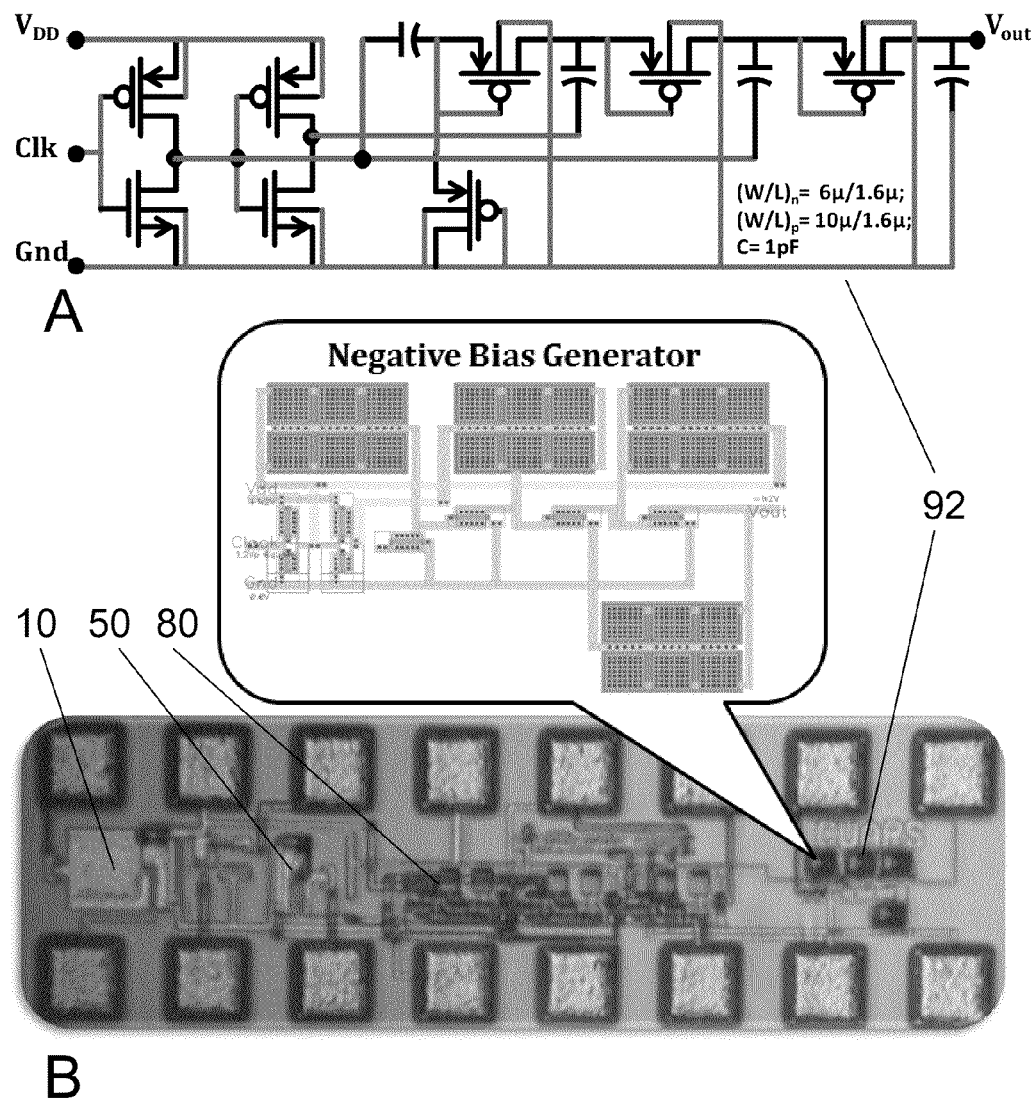
FIG. 12 shows A) a circuit schematic of a charge pump implementation of a negative bias generator for programming (pre-charging) and B) a photomicrograph of a sensor chip comprising the integrated negative bias generator.

The architecture presented herein requires that, preferably, the FG reference and sensor are charged exactly to the same level to accurately single out the radiation dose from other variations in the environment. To generate the required bias voltages, and to facilitate integrated dosimeter programming circuits, which requires very high negative voltages for p-type FGMOSFETs, a charge pump based negative bias generator test circuit has also been designed and implemented in DALSA 0.8 µm technology, as shown in FIG. 12, which shows respectively A) a circuit schematic and B) a photomicrograph of the chip comprising a negative bias generator 92 monolithically integrated with the sensor/reference FGMOSFET 1 pair 10/50, a reference MOSFET 60, and other signal processing electronics 80 as described above. The charge pump generates different negative voltage levels using a positive supply voltage, which is +1.2 V in this case. The design is based on the basic Dickson architecture. Where a clock is present in the design, this circuit can be very useful to eliminate the need for multiple biasing voltages. In absence of the clock, an on-chip ring oscillator with frequency counters can be implemented to produce the required clock for a complete self-sufficient SoC solution.

Figure 13:
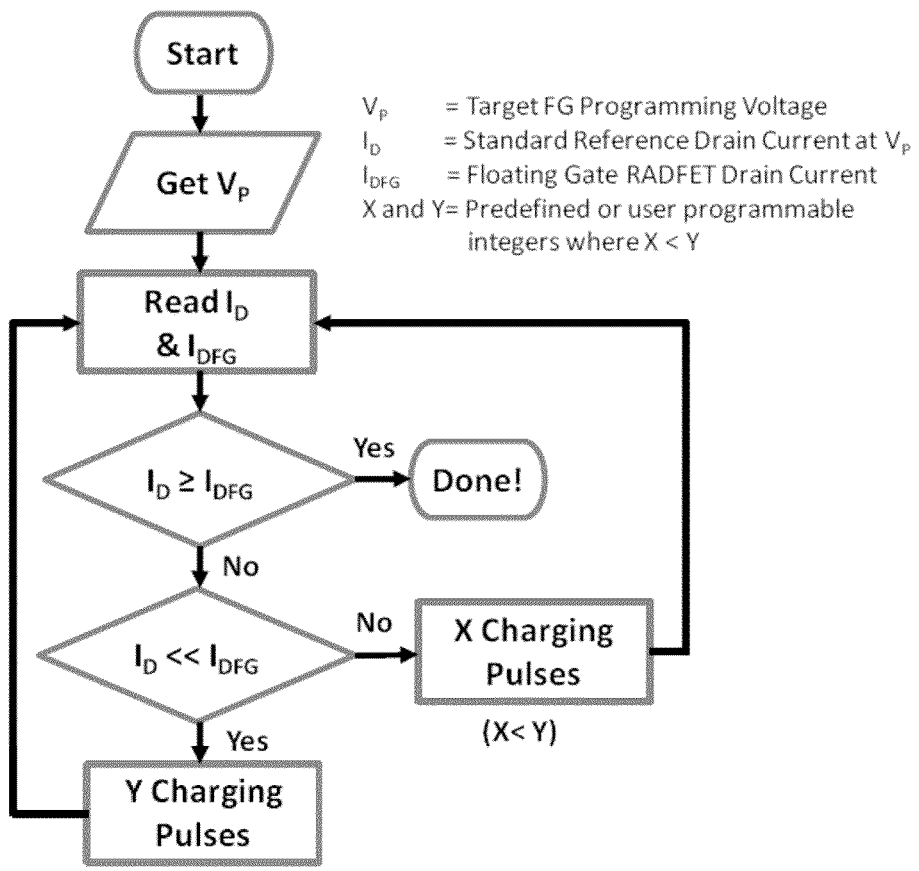
FIGS. 13 and 14 show flow diagrams, for automatic one-way and two-way programming, respectively, of the FGMOSFETS.

Automatic Floating Gate Programming (AFP) Architecture:

On chip programming using a standard single power source charge pump based bias generators and on chip temperature sensor may be used to actively compensate for behavioural changes of the FGRADFETs to provide a more reliable, enhanced sensitivity dosimeter. One way programming, ie. charging (not discharging which would require a high voltage and potentially damage the device) assumes that along with sensor and reference FGRADFETS, beneficially there is an identical standard reference MOSFET 60 on the same chip. An advantage is that it provides a reliable reference point and avoids mismatch of parameters from chip to chip A flow chart illustrating a one way programming scheme is shown in FIG. 13 and the process comprises the following steps:

1) User provides the desired voltage, $V_P$, to be programmed on the FG

2) AFP system reads the equivalent current $I_D$ by applying $V_P$ at the gate terminal of the standard reference MOS. It also reads the initial current flow $I_{DFG}$ through the FG device to be programmed.

3) Two currents are compared, if $I_D$ is smaller or equal to $I_{DFG}$, AFP stops at this point. The FG is already programmed at or more than the desired value. If it is overcharged, ultraviolet light or an ionizing radiation source can be used to bring it back to the desired level.

4) If $I_D$ is larger than $I_{DFG}$, AFP determines the difference between the two. If the two values are far from each other it sends a stream of "Y" charging pulses to the electron tunneling injector, where, Y is a pre-defined or user defined integer. On the other hand if the two currents are close to each other, AFP sends a stream of "X" charging pulses to the electron tunneling injector. X is also a pre-define or user defined integer where X<Y. This helps to fine control the charging of FG precisely to the desired value.

5) AFP reads the two currents again, and works in a cycle until it comes to a logical end.

Figure 14:
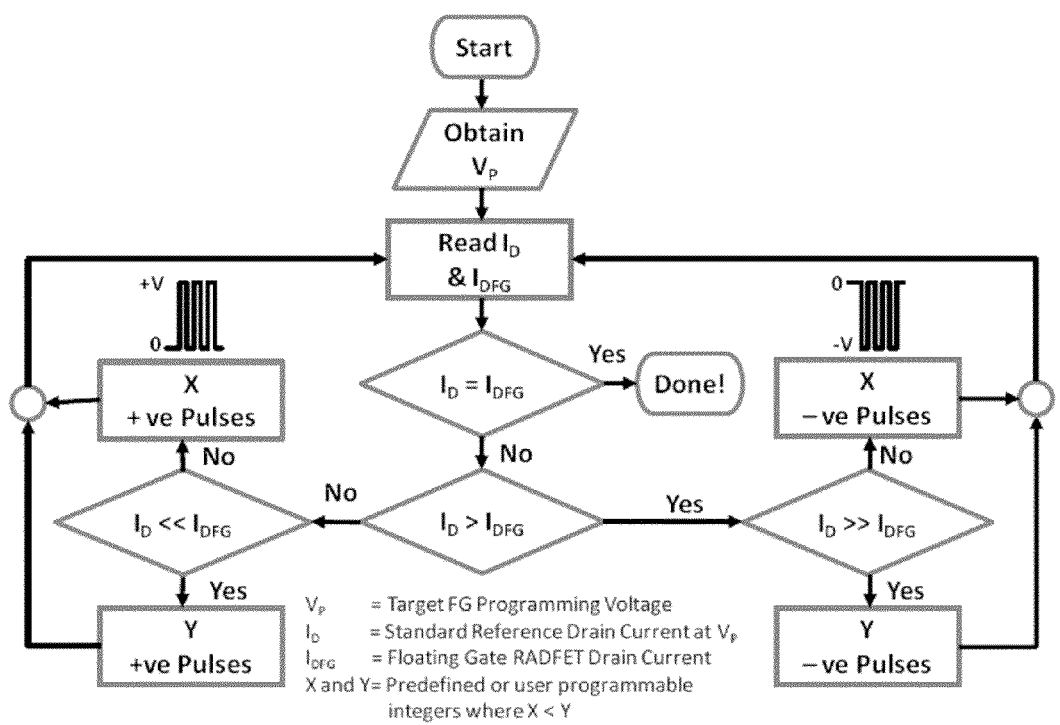

By way of comparison, a flow chart illustrating a two way programming scheme is shown in FIG. 14 This embodiment requires a dosimeter chip with sensor and reference FGRADFETs and a standard MOS reference; and a PC or a microcontroller to provide the user interface and hold the AFP algorithm; interface circuitry between the chip and the controller including dual polarity power supply. The internal circuit of the latter (not illustrated) mainly comprise solid state protection fuses and solid state switches operated by the signals from PC or micro-controller to make or break the connection between the high voltage power supply and the Injector terminals. Depending upon the maximum current flow, low voltage terminals can be directly driven by signals from the controller through a protection fuse to prevent any damage.

System on Package Implementation

Figure 15:
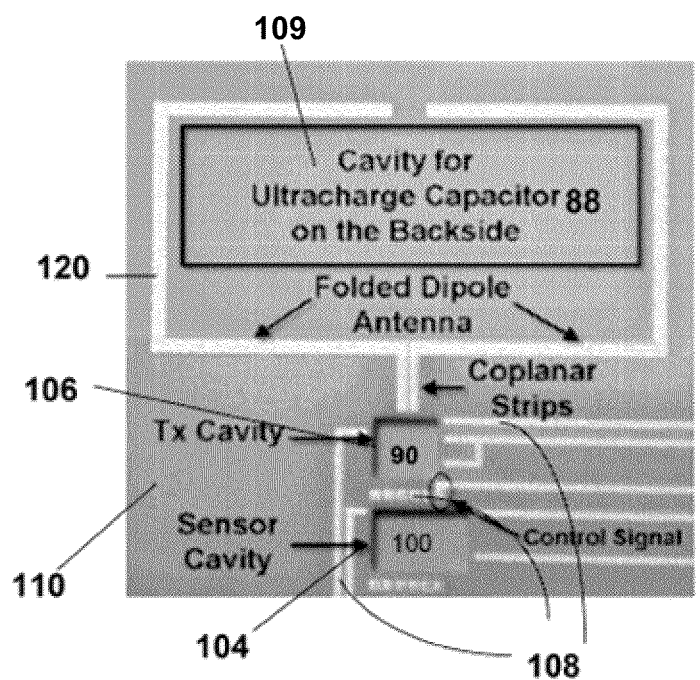
FIG. 15 shows a photomicrograph of a substrate for a System-on-Package (SoP) implementation of a wireless sensor system, according to a further embodiment.

Optionally, as shown in FIGS. 8 and 9, the output signal $V_{out}$ from the SPE may be coupled to the input of an RF transmitter, for example, an oscillator transmitter. Thus, for example, as illustrated in FIG. 15, a system-on-package implementation 200 may comprise an assembly of a suitable package substrate 110 having a cavity 104 for a first integrated circuit, i.e. the sensor chip 100 comprising a sensor/reference FGMOSFET pair 10/50 with integrated SPE 80 as shown in FIGS. 8 and 9, a second cavity 106 for a second integrated circuit, i.e. an RF transmitter chip 90, and a package antenna 120, and interconnect 108. The substrate 120 is preferably a low-loss substrate such as a multilayer ceramic substrate, e.g. LTCC (Low Temperature Co-Fired Ceramic), and carries interconnect 108 for coupling the output of the SPE 80 to the RF transmitter chip 90. The antenna 120, in this example, is a folded dipole, which is coupled to the output of the transmitter chip 90. An ultracapacitor 88 is carried in another cavity 109 on the back side of the package substrate 110 and interconnected to provide power to the signal processing electronics 80 and transmitter 90, and for biasing the FGMOSFETs 10 and 50, for read-out.

For a miniaturized wireless dosimeter SoP implementation, the power source 88 is preferably a radiation transparent and rechargeable source. A lithium polymer cell meets the requirement for small size, and transparency to incident radiation. The electrolyte is in the form of a gel instead of a liquid, which simplifies packaging. Although lithium polymer cells have lower energy density than primary cells, these polymer cells have sufficient capacity where power is needed for only a short period of time, e.g. during radiation exposure, and the cells may be recharged before each use. Suitable cells are available with a size of about 1.5 $cm^2$ which can conveniently be attached to a package such as shown in FIG. 15. As an alternative to lithium polymer cells, ultra-charged capacitors also have potential to meet the power demands of a self-powered wireless dosimeter. Ultracharged capacitors have a lower energy density compared to batteries but can support a charge of 1 $F/cm^2$, and have high efficiency, fast charging and long shelf life and cycle life. They may be implemented with voltage regulator circuitry for the transceiver architecture. Thin film, carbon based ultracapacitors, for example, are suitable if radiation transparency is required. The radiation sensor does not require power during irradiation, and the signal processing circuits 80 and RF circuits 90 can acquire the necessary power from the ultracapacitor.

Alternative Embodiments

Although embodiments of a sensor and sensor system are described using low cost CMOS technology, fabrication of the SoC using hybrid technologies and multilayer SiP implementations may provide higher gain, save power or increase communication range.

Advantageously, embodiments fabricated using a standard single poly CMOS process technology provide low cost devices operable at low voltages. Thus, monolithic integration with other circuit elements becomes feasible and. another aspect of the present invention provides for monolithic integration of a FG MOSFET sensor, e.g. a radiation sensor, with signal processing electronics. Optionally, SPE conditions the signal and converts it to the desired control signal for modulating a transmitter waveform, so that the dosimeter chip may be integrated with transmitter, preferably to transmit sensor data wirelessly for immediate read-out.

Further details of one exemplary wireless transmitter for such an application are disclosed, for example, in an article co-authored by the present inventors, entitled "Wireless Dosimeter: System-on-Chip versus System-in-Package for Biomedical and Space applications.", IEEE transaction on Circuits and Systems II: Express Briefs, vol. 55, no. 7, July 2008, which is incorporated herein by reference. This transmitter was designed for the 5.2 GHz UNII band, because it is a license-free band which is internationally available for indoor and biomedical applications, and allows for use with smaller antenna.

The radiation sensor design is not limited to that frequency band and may be coupled with wireless transmitters using operating frequencies anywhere from kHz to tens of GHz.

Signal processing electronics (SPE) can be integrated on-chip with one or more FG MOSFET sensors. A multisensor system, for example, may comprise one or more radiation sensors and/or other sensors, such as a temperature sensor. A digital modulation scheme may be used to communicate with, and identify, individual ones of several sensors.

Beneficially a miniaturized sensor that is integrated with a means of wireless communication is provided in a form that may be worn by the user, or if operating at a suitable frequency, which is readily transmitted through the body, it may be implantable or swallowable. Low cost fabrication provides for single use devices, or devices may be fabricated as reusable rechargeable modules.

Thus embodiments described above provide for a fully integrated SoC having one or more radiation sensors with signal processing and read-out circuits, which may be fabricated on the same chip.

Applications

The FGMOSFET radiation sensors described above, optionally with integrated signal processing and a wireless transmitter, have a number of industrial applications, and in particular as miniaturized and wearable wireless dosimeters for biomedical application such as radiotherapy. Although a small bias must be applied to the dosimeter after irradiation to read the dose, full sensitivity may be achieved with zero bias operation during irradiation, which is an advantage in some biomedical and applications such as radiation monitoring for Extra Vehicular Activity Radiation Monitoring (EVARM) in space. The ability to integrate the sensor system with a wireless transmitter, either in a system-on-chip or system-in-package implementation, with a miniature power source, is particularly applicable for wearable sensor for biomedical applications to avoid wired connections, and/or to provide real-time dose read-out.

Although specific embodiments have been described in detail, it will be apparent to those skilled in the art that modifications and improvements to these embodiments may be made within the scope of the following claims.

The invention claimed is:

1. A radiation sensor comprising:
a substrate comprising a device well;
a first source and a first drain, separated by a channel region, defined in the device well;
a floating gate extending over the channel region and separated therefrom by a gate dielectric layer, and an extension of the floating gate extending over a field dielectric layer adjacent the device well;
a charge injector defined in the substrate, underlying a portion of the floating gate, and separated from the floating gate by the gate dielectric layer, a charge injector source and a charge injector drain being coupled together; and
a shield dielectric layer and an electrostatic shielding layer extending over the floating gate.

2. A radiation sensor according to claim 1 wherein the first source, the first drain, and the floating gate comprise a sensor transistor, and the radiation sensor further comprises signal processing circuitry coupled to the sensor transistor that detects a change in an operating parameter of the sensor transistor indicative of radiation dose.

3. A radiation sensor according to claim 2 wherein the signal processing circuitry comprises circuitry that applies a bias to the sensor transistor and monitors a drain current of the sensor transistor.

4. A radiation sensor comprising:
a matched field effect transistor pair comprising a sensor transistor and a reference transistor on a common substrate,
each of the sensor and reference transistors comprising a device well region of the substrate having defined therein a source and a drain separated by a channel region, a gate oxide overlying the channel region and a floating gate formed thereon, and the sensor transistor further comprising an extension of the floating gate extending over an adjacent field dielectric region;
a respective charge injector associated with each floating gate and separated therefrom by a gate dielectric layer, a source and a drain of each charge injector being coupled together; and
a shield dielectric layer and a shielding layer overlying the floating gates.

5. A radiation sensor according to claim 4 wherein the respective channel widths and channel lengths of the sensor and the reference transistors are substantially identical.

6. A radiation sensor according to claim 4 wherein the charge injector of the sensor transistor is provided in the substrate laterally spaced from the device well of the sensor transistor, and the charge injector of the reference transistor is provided in the substrate laterally spaced from the device well of the reference transistor.

7. A radiation sensor according to claim 6 wherein:
each of the charge injectors comprises a second device well and a source and a drain separated by a channel region formed in the second device well;
the source and drain of each of the charge injectors is connected for coupling to a charging source;
a part of the floating gate of the sensor transistor extends over the channel region of the charge injector of the sensor transistor;
a part of the floating gate of the reference transistor extends over the channel region of the charge injector of the reference transistor; and
each of the charge injectors is separated from the part of the floating gate by the gate dielectric layer, for charging of the floating gate by drain tunneling through the gate dielectric layer.

8. A radiation sensor according to claim 7 wherein the sensor and reference transistors comprise p-channel devices defined in n-doped device wells and each of the charge injectors comprises a p-channel device defined in a p-doped device well.

9. A radiation sensor according to claim 4 wherein the shield dielectric layer comprises an intermetal dielectric comprising borophosphosilicate glass and the shielding layer comprises metal of a multilayer metal CMOS process.

10. A radiation sensor according to claim 4 wherein the sensor and reference transistors are interdigitated.

11. A radiation sensor according to claim 4 further comprising another matched field effect transistor pair, wherein respective field effect transistor pairs are connected in parallel.

12. A radiation sensor according to claim 4 further comprising signal processing circuitry that detects a change in an operating parameter indicative of radiation dose.

13. A radiation sensor according to claim 4 further comprising signal processing circuitry that applies a bias to and monitors a differential drain current of the sensor and reference transistors.

14. A sensor system-on-package assembly comprising
a package comprising first and second integrated circuits, the first integrated circuit comprising a radiation sensor according to claim 4, monolithically integrated with signal processing electronics (SPE) comprising a current to voltage converter and differential amplifier that monitors a differential change in drain current of the sensor and generates an output signal, and the second integrated circuit comprising an RF transmitter;
a low voltage power source coupled to and powering the first and second integrated circuits;
an antenna coupled to the RF transmitter; and
an interconnect coupling an output of the SPE to an input of the RF transmitter.

15. A radiation sensor comprising
a matched field effect transistor pair comprising a sensor transistor and a reference transistor on a common substrate, each of the sensor and reference transistors comprising a device well region of the substrate having defined therein a source and a drain separated by a channel region, a gate oxide overlying the channel region and a floating gate formed thereon, and the sensor transistor further comprising an extension of the floating gate extending over an adjacent field dielectric region;

a respective charge injector associated with each floating gate and separated therefrom by a gate dielectric layer;

a shield dielectric layer and a shielding layer overlying the floating gates; and signal processing circuitry that detects a change in an operating parameter indicative of radiation dose, wherein the signal processing circuitry comprises circuitry that applies a bias to and monitors a differential drain current of the sensor and reference transistors.

16. A radiation sensor according to claim 15 wherein the signal processing circuitry comprises a current-to-voltage converter and a differential amplifier coupled to the differential drain current of the sensor and reference transistors and that generates an output voltage indicative of radiation dose.

17. A radiation sensor according to claim 16 wherein the matched field effect transistor pair and the signal processing circuitry are monolithically integrated on the common substrate.

18. A radiation sensor according to claim 17 further comprising integrated pre-charging circuitry that is coupled to and pre-charges the floating gates.

19. A radiation sensor according to claim 18 further comprising a low voltage power source coupled to the sensor transistor, wherein the pre-charging circuitry comprises a negative bias generator charge pump.

20. A radiation sensor according to claim 16 further comprising a wireless transmitter coupled to an output of the signal processing circuitry.

21. A sensor according to claim 20 wherein the transmitter is operable for transmitting at a frequency in the 5 GHz U-NII band.

* * * * *